(12) United States Patent
Hashimoto et al.

(10) Patent No.: US 8,913,351 B2
(45) Date of Patent: Dec. 16, 2014

(54) MAGNETORESISTANCE EFFECT ELEMENT, MAGNETIC HEAD, MAGNETIC HEAD ASSEMBLY, AND MAGNETIC RECORDING AND REPRODUCING DEVICE

(71) Applicant: Kabushiki Kaisha Toshiba, Tokyo (JP)

(72) Inventors: Susumu Hashimoto, Tokyo (JP);
Masayuki Takagishi, Tokyo (JP);
Shuichi Murakami, Tokyo (JP);
Yousuke Isowaki, Kanagawa-ken (JP);
Naoki Hase, Tokyo (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/182,540

(22) Filed: Feb. 18, 2014

(65) Prior Publication Data

US 2014/0233135 A1 Aug. 21, 2014

(30) Foreign Application Priority Data

Feb. 18, 2013 (JP) .................................. 2013-029203

(51) Int. Cl.
*G11B 5/39* (2006.01)

(52) U.S. Cl.
CPC .................................... *G11B 5/3912* (2013.01)
USPC ........................................ 360/324.2; 360/319

(58) Field of Classification Search
USPC .............................................. 360/319, 324.2
See application file for complete search history.

(56) References Cited

U.S. PATENT DOCUMENTS

| 7,212,383 | B2 * | 5/2007 | Hasegawa et al. | 360/324.1 |
| 7,369,374 | B2 * | 5/2008 | Gill et al. | 360/324.12 |
| 7,467,459 | B2 * | 12/2008 | Gill et al. | 29/603.07 |
| 7,839,608 | B2 * | 11/2010 | Kamai et al. | 360/324.2 |
| 7,961,442 | B2 * | 6/2011 | Nishimura et al. | 360/324.2 |
| 7,969,693 | B2 * | 6/2011 | Ikarashi et al. | 360/324.2 |
| 8,018,691 | B2 * | 9/2011 | Gill et al. | 360/324.12 |
| 8,189,303 | B2 * | 5/2012 | Hara et al. | 360/319 |
| 8,279,663 | B2 * | 10/2012 | Nakayama et al. | 365/158 |
| 8,670,218 | B1 * | 3/2014 | Zeltser et al. | 360/324.2 |
| 2002/0135947 | A1 * | 9/2002 | Aoki et al. | 360/322 |
| 2005/0024790 | A1 * | 2/2005 | Pinarbasi | 360/324.2 |
| 2007/0064350 | A1 * | 3/2007 | Gill | 360/324.2 |

(Continued)

FOREIGN PATENT DOCUMENTS

JP 2009-289390 12/2009

OTHER PUBLICATIONS

Office Action dated Apr. 7, 2014 in counterpart Japanese Application No. 2013-029203 and English-language translation thereof.

*Primary Examiner* — Brian Miller
(74) *Attorney, Agent, or Firm* — Nixon & Vanderhye, P.C.

(57) ABSTRACT

According to one embodiment, a magnetoresistance effect element includes first and second shields, a stacked body and a hard bias unit. The stacked body includes first and second magnetic layers, an intermediate layer and a first Ru layer. A magnetization of the first magnetic layer is changeable. A magnetization of the second magnetic layer is changeable. The intermediate layer is nonmagnetic. The first Ru layer is provided between the first shield and the first magnetic layer. A thickness of the first Ru layer is not less than 1.5 nanometers and not more than 2.5 nanometers. The hard bias unit is provided between the first shield and the second shield. A first direction from the first shield toward the second shield intersects a second direction from the stacked body toward the hard bias unit.

21 Claims, 6 Drawing Sheets

(56) References Cited

U.S. PATENT DOCUMENTS

2008/0186638 A1* 8/2008 Nishimura et al. ........ 360/324.2
2009/0296283 A1 12/2009 Mizuno et al.
2011/0026169 A1* 2/2011 Gill et al. ................. 360/324.12
2013/0049747 A1* 2/2013 Zhou et al. .................... 324/252
2013/0279046 A1* 10/2013 Iwasaki et al. ................ 360/244
2014/0043713 A1* 2/2014 Isowaki et al. ................ 360/244

* cited by examiner

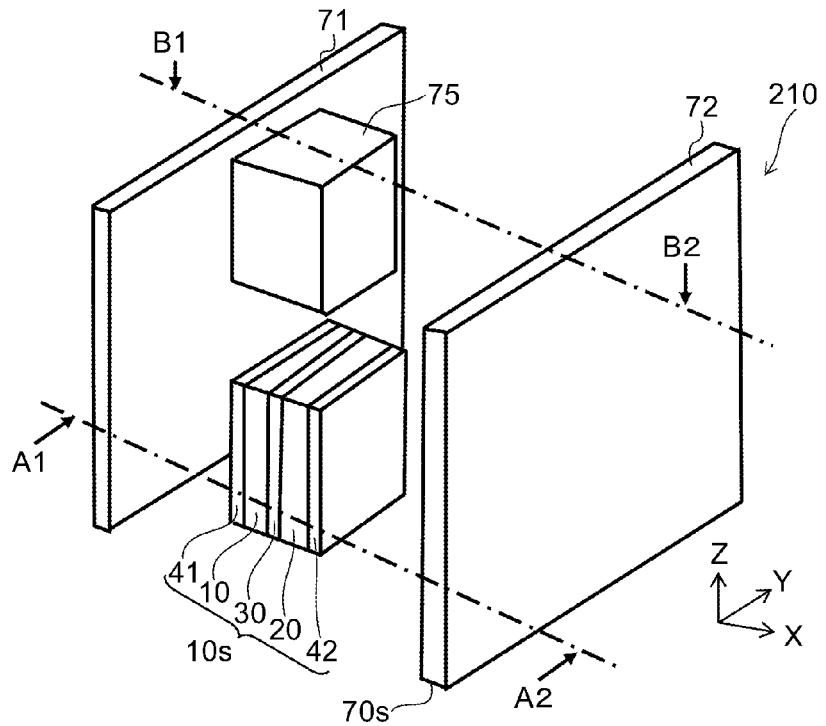
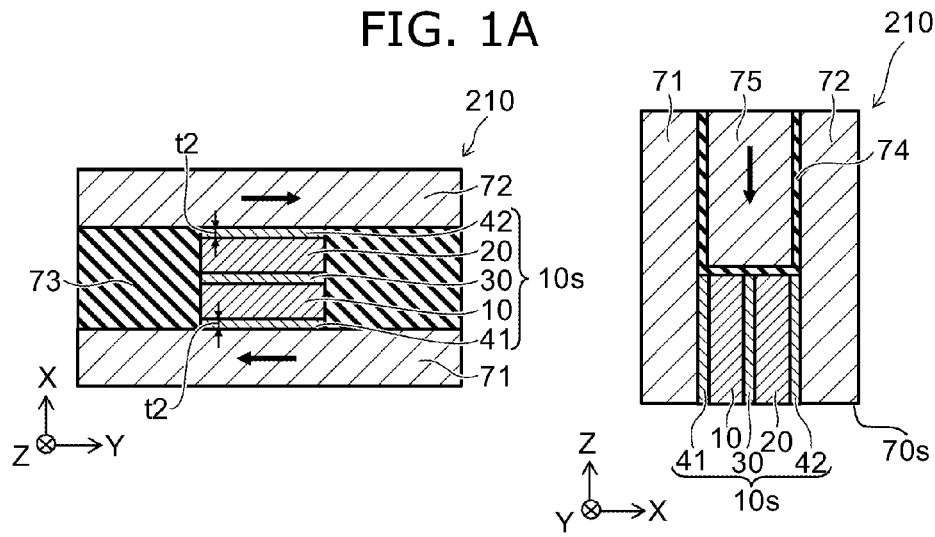 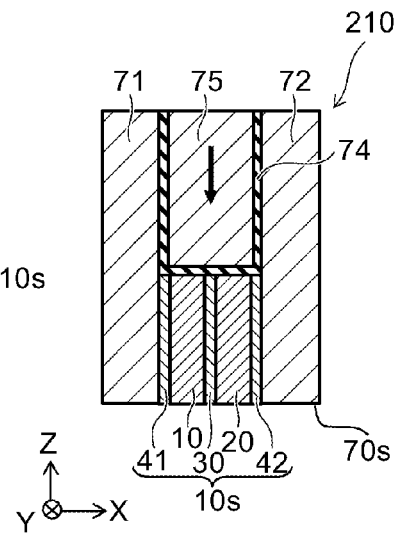
FIG. 1A
FIG. 1B
FIG. 1C

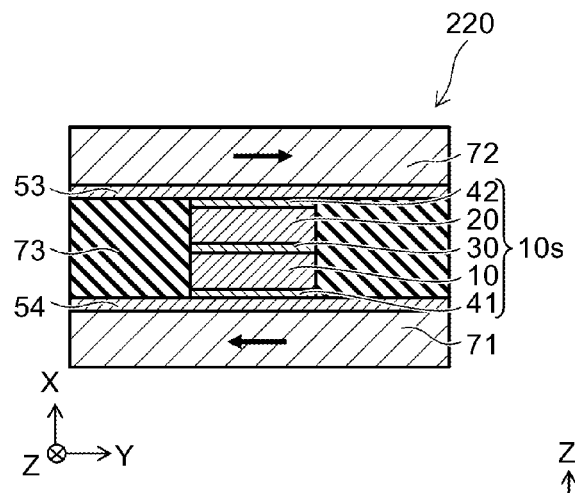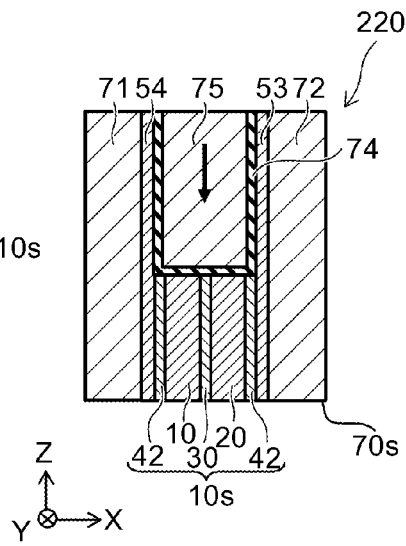
FIG. 6A  FIG. 6B
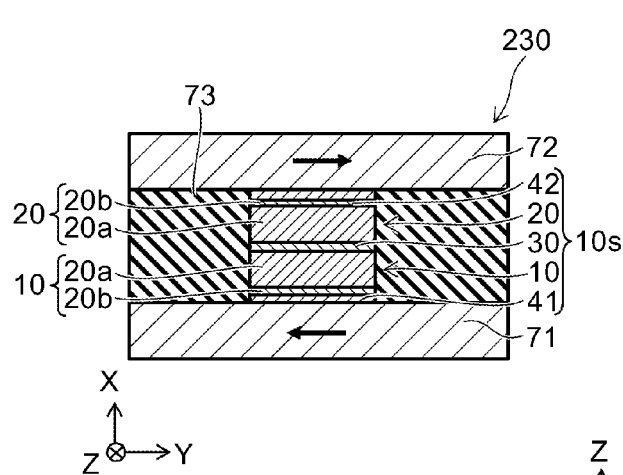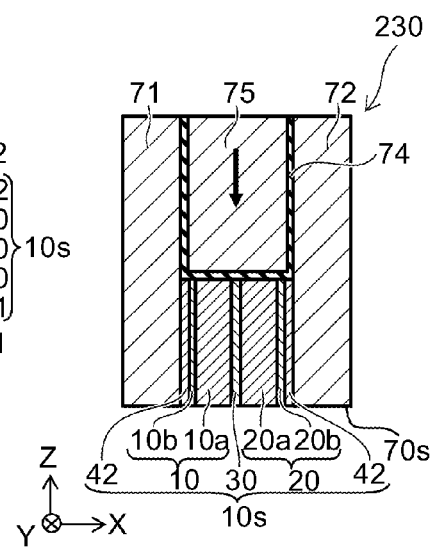
FIG. 7A  FIG. 7B

MAGNETORESISTANCE EFFECT ELEMENT, MAGNETIC HEAD, MAGNETIC HEAD ASSEMBLY, AND MAGNETIC RECORDING AND REPRODUCING DEVICE

CROSS-REFERENCE TO RELATED APPLICATIONS

This application is based upon and claims the benefit of priority from the Japanese Patent Application No. 2013-029203, filed on Feb. 18, 2013; the entire contents of which are incorporated herein by reference.

FIELD

Embodiments described herein relate generally to a magnetoresistance effect element, a magnetic head, a magnetic head assembly, and a magnetic recording and reproducing device.

BACKGROUND

For example, a TMR head (Tunneling Magneto Resistive head) is used to reproduce signals of a HDD (Hard Disk Drive). A magnetic stacked film is provided between two shields in a magnetoresistance effect element provided in the TMR head. It is desirable to increase the resolution and reduce the noise of the magnetoresistance effect element.

BRIEF DESCRIPTION OF THE DRAWINGS

FIG. 1A to FIG. 1C are schematic views showing a magnetoresistance effect element according to a first embodiment;

FIG. 6A and FIG. 6B are schematic cross-sectional views showing a magnetoresistance effect element according to a second embodiment;

FIG. 7A and FIG. 7B are schematic cross-sectional views showing a magnetoresistance effect element according to a third embodiment;

DETAILED DESCRIPTION

Figure 2:
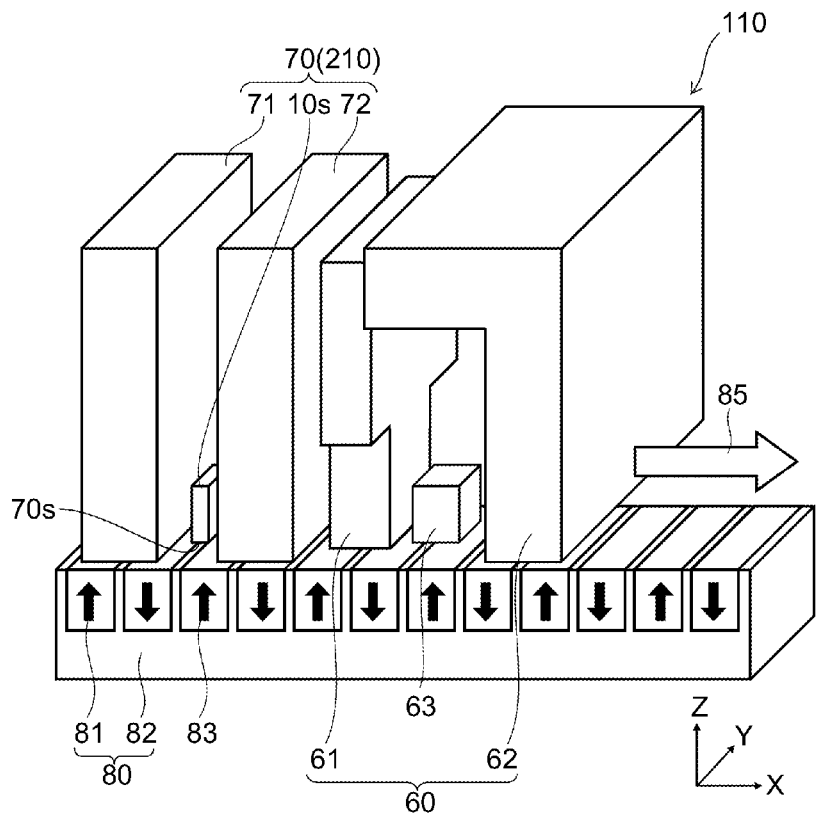
FIG. 2 is a schematic perspective view showing the magnetic head to which the magnetoresistance effect element according to the first embodiment is mounted.

In general, according to one embodiment, a magnetoresistance effect element includes a first shield, a second shield, a stacked body and a hard bias unit. The stacked body includes a first magnetic layer, a second magnetic layer, an intermediate layer and a first Ru layer. The first magnetic layer is provided between the first shield and the second shield. A magnetization of the first magnetic layer is changeable. The second magnetic layer is provided between the first magnetic layer and the second shield. A magnetization of the second magnetic layer is changeable. The intermediate layer is provided between the first magnetic layer and the second magnetic layer. The intermediate layer is nonmagnetic. The first Ru layer is provided between the first shield and the first magnetic layer. A thickness of the first Ru layer is not less than 1.5 nanometers and not more than 2.5 nanometers. The hard bias unit is provided between the first shield and the second shield. A first direction from the first shield toward the second shield intersects a second direction from the stacked body toward the hard bias unit.

In general, according to one embodiment, a magnetic head includes a magnetoresistance effect element. The magnetoresistance effect element includes a first shield, a second shield, a stacked body and a hard bias unit. The stacked body includes a first magnetic layer, a second magnetic layer, an intermediate layer and a first Ru layer. The first magnetic layer is provided between the first shield and the second shield. A magnetization of the first magnetic layer is changeable. The second magnetic layer is provided between the first magnetic layer and the second shield. A magnetization of the second magnetic layer is changeable. The intermediate layer is provided between the first magnetic layer and the second magnetic layer. The intermediate layer is nonmagnetic. The first Ru layer is provided between the first shield and the first magnetic layer. The thickness of the first Ru layer is not less than 1.5 nanometers and not more than 2.5 nanometers. The hard bias unit is provided between the first shield and the second shield. A first direction from the first shield toward the second shield intersects a second direction from the stacked body toward the hard bias unit.

In general, according to one embodiment, a magnetic head assembly includes a magnetic head, a suspension and an actuator arm. The magnetic head includes a magnetoresistance effect element. The magnetoresistance effect element includes a first shield, a second shield, a stacked body and a hard bias unit. The stacked body includes a first magnetic layer, a second magnetic layer, an intermediate layer and a first Ru layer. The first magnetic layer is provided between the first shield and the second shield. A magnetization of the first magnetic layer is changeable. The second magnetic layer is provided between the first magnetic layer and the second shield. A magnetization of the second magnetic layer is changeable. The intermediate layer is provided between the first magnetic layer and the second magnetic layer. The intermediate layer is nonmagnetic. The first Ru layer is provided between the first shield and the first magnetic layer. The thickness of the first Ru layer is not less than 1.5 nanometers and not more than 2.5 nanometers. The hard bias unit is provided between the first shield and the second shield. A first direction from the first shield toward the second shield intersects a second direction from the stacked body toward the hard bias unit. The suspension is configured to have the magnetic head mounted to one end of the suspension. The actuator arm is connected to one other end of the suspension.

In general, according to one embodiment, a magnetic recording and reproducing device includes a magnetic head assembly and a magnetic recording medium. The magnetic head assembly includes a magnetic head, a suspension and an actuator arm. The magnetic head includes a magnetoresistance effect element. The magnetoresistance effect element includes a first shield, a second shield, a stacked body and a hard bias unit. The stacked body includes a first magnetic layer, a second magnetic layer, an intermediate layer and a first Ru layer. The first magnetic layer is provided between the first shield and the second shield. A magnetization of the first magnetic layer is changeable. The second magnetic layer is provided between the first magnetic layer and the second shield. A magnetization of the second magnetic layer is changeable. The intermediate layer is provided between the first magnetic layer and the second magnetic layer. The intermediate layer is nonmagnetic. The first Ru layer is provided between the first shield and the first magnetic layer. The thickness of the first Ru layer is not less than 1.5 nanometers and not more than 2.5 nanometers. The hard bias unit is provided between the first shield and the second shield. A first direction from the first shield toward the second shield intersects a second direction from the stacked body toward the hard bias unit. The suspension is configured to have the magnetic head mounted to one end of the suspension. The actuator arm is connected to one other end of the suspension. The magnetic recording medium includes information configured to be reproduced using the magnetic head mounted in the magnetic head assembly.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A to FIG. 1C are schematic views showing a magnetoresistance effect element according to a first embodiment.

FIG. 1A is a schematic perspective view. For easier viewing of the drawing in FIG. 1A, the insulating portions are omitted, and some of the components are shown as being separated from each other. FIG. 1B is a cross-sectional view corresponding to line A1-A2 of FIG. 1A. FIG. 1C is a cross-sectional view corresponding to line B1-B2 of FIG. 1A.

As shown in FIG. 1A to FIG. 1C, the magnetoresistance effect element 210 according to the embodiment includes a first shield 71, a second shield 72, a stacked body 10s, and a hard bias unit 75.

The first shield 71 and the second shield 72 are separated from each other. A direction from the first shield 71 toward the second shield 72 is taken as the stacking direction (a first direction). The first direction is taken as an X-axis direction. One direction perpendicular to the X-axis direction is taken as a Y-axis direction. A direction perpendicular to the X-axis direction and the Y-axis direction is taken as a Z-axis direction. A second direction is taken to be a direction intersecting the stacking direction (the first direction). The second direction is, for example, the Z-axis direction.

The stacked body 10s is provided between the first shield 71 and the second shield 72. The stacked body 10s includes a first magnetic layer 10, a second magnetic layer 20, and an intermediate layer 30. The first magnetic layer 10 is provided between the first shield 71 and the second shield 72. The orientation of the magnetization of the first magnetic layer 10 is changeable. The second magnetic layer 20 is provided between the first magnetic layer 10 and the second shield 72. The orientation of the magnetization of the second magnetic layer 20 is changeable. The intermediate layer 30 is provided between the first magnetic layer 10 and the second magnetic layer 20 and is nonmagnetic. The first magnetic layer 10 and the second magnetic layer 20 are, for example, ferromagnetic. The first magnetic layer 10 and the second magnetic layer 20 are, for example, free magnetic layers.

The stacked body 10s further includes at least one selected from a first Ru layer 41 and a second Ru layer 42. In the example, both the first Ru layer 41 and the second Ru layer 42 are provided.

The first Ru layer 41 is provided between the first shield 71 and the first magnetic layer 10. The thickness (a first thickness t1) of the first Ru layer is not less than 1.5 nanometers (nm) and not more than 2.5 nm. For example, the first Ru layer 41 contacts the first magnetic layer 10.

The second Ru layer 42 is provided between the second magnetic layer 20 and the second shield 72. The thickness (a second thickness t2) of the second Ru layer 42 is not less than 1.5 nm and not more than 2.5 nm. For example, the second Ru layer 42 contacts the second magnetic layer 20.

The stacked body 10s is a magnetoresistance effect element portion.

In the example as shown in FIG. 1B, the magnetoresistance effect element 210 further includes a first insulating unit 73. The first insulating unit 73 is provided between the first shield 71 and the second shield 72 around the stacked body 10s.

The hard bias unit 75 is provided between the first shield 71 and the second shield 72 to be arranged with the stacked body 10s in the second direction (in the example, the Z-axis direction).

In the example as shown in FIG. 1C, the magnetoresistance effect element 210 further includes a second insulating unit 74. The second insulating unit 74 is provided between the stacked body 10s and the hard bias unit 75. In the example, the second insulating unit 74 extends between the first shield 71 and the hard bias unit 75 and between the second shield 72 and the hard bias unit 75.

Such a magnetoresistance effect element 210 is used, for example, in a magnetic head. In such a case, a medium-opposing surface 70s (an air bearing surface (ABS)) is provided in the magnetoresistance effect element 210. An example of the magnetic head will now be described.

FIG. 2 is a schematic perspective view showing the magnetic head to which the magnetoresistance effect element according to the first embodiment is mounted.

As shown in FIG. 2, a magnetic head 110 includes a reproducing unit 70 (a reproducing head unit). In the example, the magnetic head 110 further includes a write unit 60 (a write head unit). The magnetoresistance effect element 210 according to the embodiment is used as the reproducing unit 70.

In FIG. 2, some of the components included in the reproducing unit 70 (the magnetoresistance effect element 210) are not shown.

The write unit 60 includes, for example, a major electrode 61 and a write unit return path 62. In the magnetic head 110, the write unit 60 may further include a portion that assists the writing operation such as, for example, a spin torque oscillator (STO) 63, etc. The write unit 60 may have any configuration in the magnetic head 110.

For example, the stacked body 10s, the first shield 71, and the second shield 72 are provided in the reproducing unit 70.

The components of the reproducing unit 70 and the components of the write unit 60 are separated from each other by an insulator such as, for example, alumina, etc.

Figure 3:
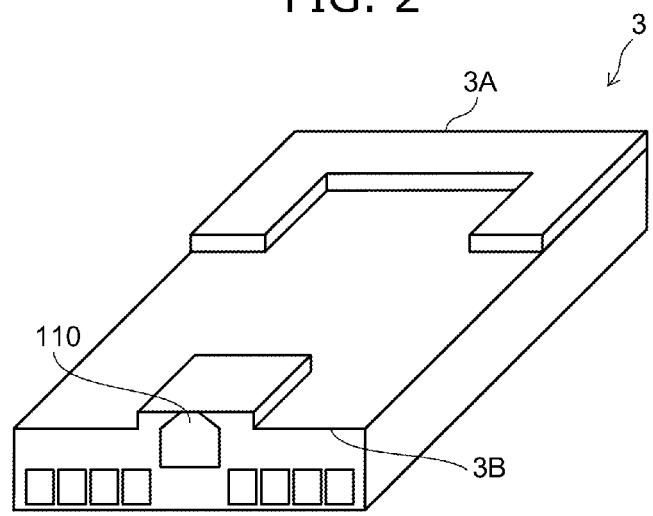
FIG. 3 is a schematic perspective view showing a head slider to which the magnetoresistance effect element according to the first embodiment is mounted.

FIG. 3 is a schematic perspective view showing a head slider to which the magnetoresistance effect element according to the first embodiment is mounted.

As shown in FIG. 3, the magnetic head 110 is mounted to the head slider 3. The head slider 3 includes, for example, $Al_2O_3$/TiC, etc. The head slider 3 moves relative to a magnetic recording medium 80 while flying over or contacting the magnetic recording medium 80 such as a magnetic disk, etc.

The head slider 3 has, for example, an air inflow side 3A and an air outflow side 3B. The magnetic head 110 is disposed at the side surface of the air outflow side 3B of the head slider 3 or the like. Thereby, the magnetic head 110 mounted to the head slider 3 moves relative to the magnetic recording medium 80 while flying over or contacting the magnetic recording medium 80.

As shown in FIG. 2, the magnetic recording medium 80 includes, for example, a medium substrate 82, and a magnetic recording layer 81 provided on the medium substrate 82. A magnetization 83 of the magnetic recording layer 81 is controlled by the magnetic field applied by the write unit 60; and the writing operation is thereby implemented. The magnetic recording medium 80 moves relative to the magnetic head 110 along a medium movement direction 85.

The reproducing unit 70 is disposed to oppose the magnetic recording medium 80. The reproducing unit 70 has the medium-opposing surface 70s (the air bearing surface (ABS)) opposing the magnetic recording medium 80. The magnetic recording medium 80 moves relative to the magnetic head 110 along the medium movement direction 85. The reproducing unit 70 senses the direction of the magnetization 83 of the magnetic recording layer 81. Thereby, the reproduction operation is performed. The reproducing unit 70 senses the recorded signal recorded in the magnetic recording medium 80.

For example, the Z-axis direction is the height direction. The X-axis direction corresponds to, for example, the recording track movement direction (the track direction) of the magnetic recording medium 80. The Y-axis direction corresponds to, for example, the recording track width direction (the track width direction) of the magnetic recording medium 80. The track width direction specifies the bit width.

In the embodiment, a Ru layer (e.g., at least one selected from the first Ru layer 41 and the second Ru layer 42) is provided in the stacked body 10s; and the thickness of the Ru layer is set to be not less than 1.5 nm and not more than 2.5 nm. Thereby, a magnetoresistance effect element and a magnetic head having high resolution and low noise can be provided.

The inventor of the application discovered that high resolution can be obtained and noise can be reduced by the thickness of the Ru layer being about 2 nm.

The Ru layer provided between the shield and the magnetic layer may be used as a magnetic coupling layer. In such a case, the thickness of the Ru layer normally is set to be about 0.9 nm. Conversely, in the magnetoresistance effect element 210 according to the embodiment, the thickness of the Ru layer is set to be extremely thick, i.e., about twice the normal value.

In the case where the thickness of the Ru layer is set to be thick, i.e., about 2 nm, it is considered that the exchange coupling between the shield and the magnetic layer becomes weaker than that of the case of a thickness of about 0.9 nm which is generally used. The inventor of the application considered that good characteristics such as those recited above can be obtained by reducing the strength of the exchange coupling between the shield and the magnetic layer. Based on such a hypothesis, the inventor of the application derived the configuration according to the embodiment by performing experiments such as those recited below. The experiments performed independently by the inventor of the application will now be described.

In a first experiment, another layer (an interface layer) is interposed between the Ru layer and the magnetic layer; and the strength of the exchange coupling between the shield and the magnetic layer in such a case is evaluated. In the experiment, the thickness of the Ru layer is constant at 0.9 nm which is generally used.

The samples of the first experiment are made as follows.

A Ta layer (not shown) having a thickness of about 2 nm is formed as an adhesion layer on a substrate (not shown). A shield layer (corresponding to the first shield 71) is formed on the Ta layer. Specifically, a permalloy layer (a $Ni_{80}Fe_{20}$ layer) having a thickness of about 50 nm is formed. A Ru layer (corresponding to the first Ru layer 41) is formed on the shield layer. The thickness of the Ru layer is 0.9 nm. Various layers (interface layers) of different materials are formed on the Ru layer. A soft magnetic amorphous alloy of $Co_{80}Zr_{10}Nb_{10}$ (atomic %), Fe, an FeCr alloy, an FeV alloy, a CoFe alloy, etc., are formed as the interface layer. The thickness of the interface layer is 2 nm. A magnetic layer (corresponding to the first magnetic layer 10) is formed on the interface layer. Specifically, as the magnetic layer, an FeCo layer having a thickness of 2.0 nm is formed; and a CoFeMnGe layer having a thickness of 3.0 nm is formed on the FeCo layer. A Cu layer corresponding to the intermediate layer 30 is formed with a thickness of 3 nm on the magnetic layer. A Ta layer having a thickness of 2 nm is formed as a protective layer on the Cu layer. Subsequently, heat treatment is performed in a magnetic field for one hour at 290° C.

The magnetic exchange coupling energy between the shield layer and the magnetic layer is measured using a VSM (Vibrating Sample Magnetometer) for the samples having the different materials as the interface layer.

The magnetic exchange coupling energy between the shield and the magnetic layer is 0.09 erg/$cm^2$ in the case where a soft magnetic amorphous alloy layer of $Co_{80}Zr_{10}Nb_{10}$ (atomic %) is used as the interface layer.

The magnetic exchange coupling energy between the shield and the magnetic layer is 0.14 erg/$cm^2$ in the case where Fe is used as the interface layer.

The magnetic exchange coupling energy between the shield and the magnetic layer is 0.07 erg/$cm^2$ in the case where FeCr is used as the interface layer.

The magnetic exchange coupling energy between the shield and the magnetic layer is 0.06 erg/$cm^2$ in the case where FeV is used as the interface layer.

The magnetic exchange coupling energy between the shield and the magnetic layer is 0.4 erg/$cm^2$ in the case where CoFe is used as the interface layer.

Thus, the magnetic exchange coupling energy between the shield and the magnetic layer changes greatly when changing the material of the interface layer provided between the Ru layer and the magnetic layer.

Also, the characteristics (in the example, the resolution and the noise) as a magnetic head are evaluated for the samples having the different materials as the interface layer. The relationship between the characteristics and the magnetic exchange coupling energy will now be described.

Figure 4A:
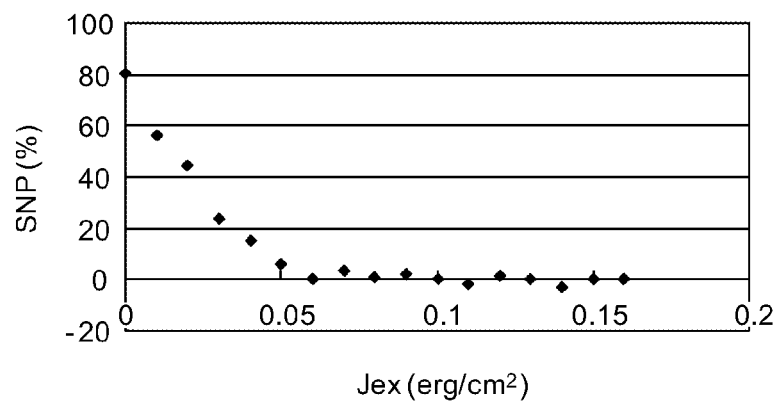
FIG. 4A and FIG. 4B are graphs showing characteristics of the magnetoresistance effect element.
Figure 4B:
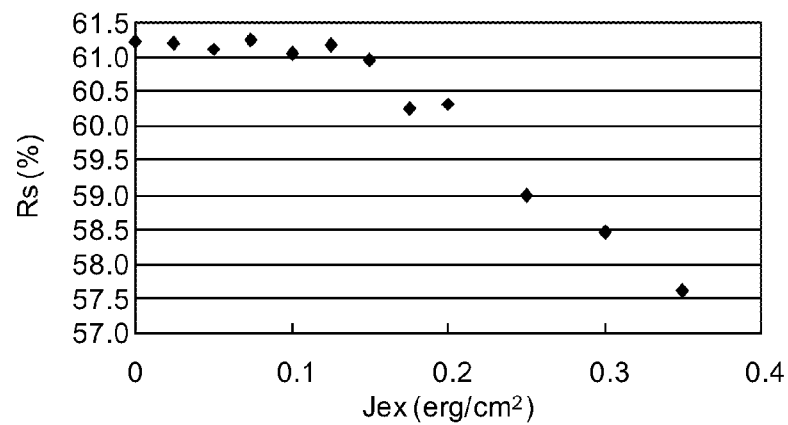

FIG. 4A and FIG. 4B are graphs showing characteristics of the magnetoresistance effect element.

The vertical axis of FIG. 4A is a switching noise power SNP (%). A small value of the switching noise power SNP indicates low noise. The vertical axis of FIG. 4B is a resolution Rs (%) of the magnetoresistance effect element. The resolution Rs is defined as the ratio (percent) of the reproduction output (TAA1) when recorded at the highest frequency to the reproduction output (TAA2) when recorded at the lowest frequency. In other words, Rs=(TAA1/TAA2)×100%. The highest frequency is 164 MHz in the example; and the lowest frequency is 27 MHz in the example. The resolution is high when the value of the resolution Rs is large. In FIG. 4A and FIG. 4B, the horizontal axis is a magnetic exchange coupling energy Jex (erg/square centimeter (erg/cm$^2$)) between the magnetic layer (the free magnetic layer) and the shield. The magnetic exchange coupling energy Jex is a value measured by VSM.

It can be seen from FIG. 4A that the switching noise power SNP is large when the magnetic exchange coupling energy Jex is less than 0.05 erg/cm$^2$. It is considered that this is because the magnetic exchange coupling energy is too small and the unidirectional bias applied to the free magnetic layer from the shield is not effective. Switching noise occurs for such a condition. When the magnetic exchange coupling energy Jex is not less than 0.05 erg/cm$^2$, the switching noise power SNP is small; and a low-noise operation can be realized.

It can be seen from FIG. 4B that the resolution Rs decreases when the magnetic exchange coupling energy Jex exceeds 0.15 erg/cm$^2$. It is considered that this is because the magnetic exchange coupling energy is too large; the magnetization of the portion of the shield proximal to the free magnetic layer no longer moves easily; and the shield function degrades. The value of the resolution Rs is high when the magnetic exchange coupling energy Jex is not more than 0.15 erg/cm$^2$. High resolution can be maintained at such a condition.

It can be seen from the results recited above that it is favorable for the magnetic exchange coupling energy Jex between the first magnetic layer 10 and the first shield 71 to be not less than 0.05 erg/cm$^2$ and not more than 0.15 erg/cm$^2$. It can be seen that it is favorable to set the magnetic exchange coupling energy Jex between the second magnetic layer 20 and the second shield 72 to be not less than 0.05 erg/cm$^2$ and not more than 0.15 erg/cm$^2$. Thereby, low noise and high resolution are obtained.

In a second experiment described below, the magnetic exchange coupling energy between the shield and the magnetic layer is evaluated for samples in which the thickness of the Ru layer is changed without using an interface layer such as that recited above.

The samples recited below are made in the second experiment.

Similarly to the first experiment, an adhesion layer (a Ta layer having a thickness of about 2 nm) is formed on a substrate; and a shield layer (a Ni$_{80}$Fe$_{20}$ layer having a thickness of about 50 nm) is formed on the adhesion layer. A Ru layer is formed on the shield layer. At this time, multiple samples are made such that the thickness of the Ru layer is changed within a range not less than 0.5 nm and not more than 3.0 nm. The thickness of the Ru layer is modified in 0.1 nm steps. An FeCo layer having a thickness of 2.0 nm is formed as a magnetic layer on the Ru layer; and a CoFeMnGe layer having a thickness of 3.0 nm is formed on the FeCo layer. The intermediate layer 30 (a Cu layer having a thickness of 3 nm) is formed on the magnetic layer. A protective layer (a Ta layer having a thickness of about 2 nm) is formed on the Cu layer. Subsequently, heat treatment is performed in a magnetic field for one hour at 290° C.

The magnetic exchange coupling energy between the shield layer and the magnetic layer is measured using VSM for the samples having different Ru layer thicknesses.

Figure 5:
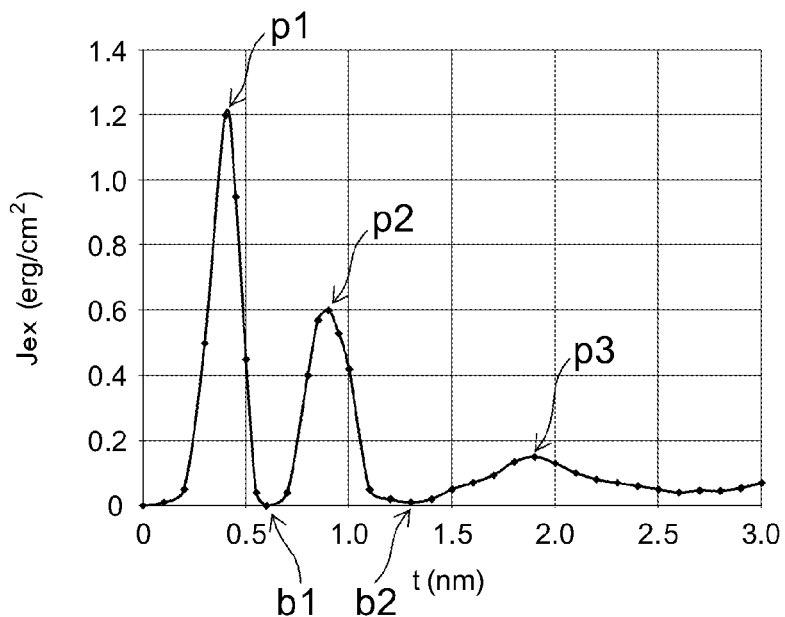
FIG. 5 is a graph showing characteristics of the magnetoresistance effect element.

FIG. 5 is a graph showing characteristics of the magnetoresistance effect element.

FIG. 5 shows the measurement results of the magnetic exchange coupling energy Jex between the magnetic layer and the shield for the samples in which the thickness of the Ru layer between the magnetic layer (e.g., the first magnetic layer 10) and the shield (e.g., the first shield 71) is changed. The horizontal axis is the thickness t (nm) of the Ru layer; and the vertical axis is the magnetic exchange coupling energy Jex (erg/cm$^2$).

It can be seen from FIG. 5 that the magnetic exchange coupling energy Jex has multiple peaks as the thickness t of the Ru layer changes.

In the example, a first peak p1 occurs when the thickness t of the Ru layer is about 0.4 nm (not less than 0.38 nm and not more than 0.43 nm). At the first peak p1, the magnetic exchange coupling energy Jex is about 1.2 erg/cm$^2$ (not less than 1.0 erg/cm$^2$ and not more than 1.2 erg/cm$^2$).

A second peak p2 occurs when the thickness t of the Ru layer is about 0.9 nm (not less than 0.8 nm and not more than 1.0 nm). At the second peak p2, the magnetic exchange coupling energy Jex is 0.6 erg/cm$^2$ (not less than 0.4 erg/cm$^2$ and not more than 0.6 erg/cm$^2$).

A third peak p3 occurs when the thickness t of the Ru layer is about 1.9 nm (not less than 1.5 nm and not more than 2.5 nm). At the third peak p3, the magnetic exchange coupling energy Jex value is about 0.15 erg/cm$^2$ (not less than 0.05 erg/cm$^2$ and not more than 0.15 erg/cm$^2$).

The magnetic exchange coupling energy Jex is extremely small, i.e., not more than about 0.04 erg/cm$^2$, at a first bottom b1 (where the thickness t is not less than 0.55 nm and not more than 0.70 nm) that is positioned between the first peak p1 and the second peak p2.

Also, the magnetic exchange coupling energy Jex is extremely small, i.e., not more than about 0.04 erg/cm$^2$, at a second bottom b2 (where the thickness t is not less than 1.2 nm and not more than 1.4 nm) that is positioned between the second peak p2 and the third peak p3.

As described in regard to the first experiment, high-resolution and low-noise characteristics are obtained by the magnetic exchange coupling energy Jex between the shield and the magnetic layer being set to be not less than 0.05 erg/cm$^2$ and not more than 0.15 erg/cm$^2$. Accordingly, from the results of FIG. 5, it is considered that it is favorable to set the thickness t of the Ru layer to obtain a magnetic exchange coupling energy Jex having such a value.

For example, it can be seen from FIG. 5 that a magnetic exchange coupling energy Jex having such a value is obtained in the range between the first peak p1 and the first bottom b1, the range between the first bottom b1 and the second peak p2, and the range between the second peak p2 and the second bottom b2. However, in such ranges, the magnetic exchange coupling energy Jex changes steeply with respect to the thickness t. In other words, to use such ranges, it becomes necessary to control the fluctuation of the thickness t of the Ru layer with extremely high precision to obtain the desired value of the magnetic exchange coupling energy Jex; and it is not practical to use such ranges.

Conversely, by setting the thickness t of the Ru layer to be substantially the value of the third peak p3, the desired value of the magnetic exchange coupling energy Jex is obtained stably.

On the other hand, the values of the magnetic exchange coupling energy Jex obtained at the first peak p1 and the second peak p2 are undesirably greater than that of the favorable range recited above.

In the embodiment, the thickness of the Ru layer is set to be not less than 1.5 nm and not more than 2.5 nm based on such first and second experiments. In other words, the thickness of the Ru layer is set to be the thickness t corresponding to the third peak p3. As shown in FIG. 5, the magnetic exchange coupling energy Jex is not less than 0.05 erg/cm$^2$ and not more than 0.15 erg/cm$^2$ when the thickness t of the Ru layer is not less than 1.5 nm and not more than 2.5 nm. Thereby, a magnetoresistance effect element and a magnetic head having high resolution and low noise can be provided.

It is considered that the first peak shown in FIG. 5 corresponds to, for example, the first peak (1st peak) of RKKY (Rudermann-Kittel-Kasuya-Yoshida) coupling. It is considered that the second peak corresponds to, for example, the second peak (2nd peak) of RKKY coupling. It is considered that the third peak corresponds to, for example, the third peak (3rd peak) of RKKY coupling.

Generally, in the case where a Ru layer is used in a magnetoresistance effect element, the Ru layer is designed to have relatively strong magnetic coupling. To this end, the thickness of the Ru layer is set to be a thickness corresponding to the first peak p1 (not less than 0.38 nm and not more than 0.43 nm) or a thickness corresponding to the second peak p2 (not less than 0.8 nm and not more than 1.0 nm).

Conversely, in the embodiment, the thickness t of the Ru layer is set to be not less than 1.5 nm and not more than 2.5 nm. Thereby, high resolution is obtained while suppressing the occurrence of noise.

In the case where the thickness of the Ru layer is not more than 1.5 nm, the magnetic exchange coupling energy Jex is too strong; and the magnetization of the portion of the shield proximal to the free magnetic layer no longer moves easily. Therefore, the shield function degrades; and the resolution decreases. In the case where the thickness of the Ru layer exceeds 2.5 nm, the magnetic exchange coupling energy Jex becomes excessively small; and the bias due to the shield layer is not effective. Therefore, the switching noise occurs easily.

There is a reproducing magnetic head having a trilayer structure. In the trilayer structure, two magnetic layers (free magnetic layers) are provided between two shields; and an intermediate layer that is nonmagnetic is provided between the two magnetic layers. In such a structure, there are cases where an exchange coupling layer having strong magnetic coupling such as a Ru layer, etc., is provided between the shield layer and the magnetic layer.

As recited above, the inventor of the application discovered that the noise increases in a trilayer structure that uses such an exchange coupling layer having strong magnetic coupling. By using such an exchange coupling layer having strong magnetic coupling, the magnetic layer (the free magnetic layer) is in the state of being magnetically coupled to the shield. Thus, the configuration in which the free magnetic layer is strongly magnetically coupled to the shield is referred to herein as being shield-coupled. It was found that noise occurs easily in a shield-coupled configuration that utilizes strong magnetic coupling.

The inventor of the application discovered that the noise caused by the shield can be suppressed by using an exchange coupling layer having magnetic coupling that is not strong but weak (having a magnetic exchange coupling energy Jex not less than 0.05 erg/cm$^2$ and not more than 0.15 erg/cm$^2$). It was found that the problems caused by the shield can be suppressed by reducing the magnetic exchange coupling energy.

In the embodiment, the first thickness t1 of the first Ru layer 41 is set to be not less than 1.5 nm and not more than 2.5 nm. Thereby, weak magnetic coupling is obtained between the first magnetic layer 10 and the first shield 71. On the other hand, the second thickness t2 of the second Ru layer 42 is set to be not less than 1.5 nm and not more than 2.5 nm. Thereby, weak magnetic coupling is obtained between the second magnetic layer 20 and the second shield 72.

Examples of components included in the magnetoresistance effect element 210 will now be described.

The first shield 71 and the second shield 72 include magnetic bodies. At least one selected from these shields may include a NiFe alloy. For example, $Ni_{80}Fe_{20}$ (atomic ratio) may be used as the NiFe alloy. The NiFe alloy is, for example, permalloy. The first shield 71 and the second shield 72 may include a material having excellent soft magnetic properties and a shield function. At least one selected from the first shield 71 and the second shield 72 may include, for example, at least one selected from the group consisting of CoZrTa, CoZrNb, CoZrNbTa, CoZrTaCr, and CoZrFeCr. The material and thickness of the first shield 71 may be the same as or different from the material and thickness of the second shield 72.

For example, the first shield 71 and the second shield 72 may be used as paths of the current flowing in the stacked body 10s. In other words, the first shield 71 and the second shield 72 function as electrodes.

The first magnetic layer 10 and the second magnetic layer 20 include, for example, a ferromagnetic material. At least one selected from the first magnetic layer 10 and the second magnetic layer 20 may include, for example, at least one selected from the group consisting of CoFe, CoFeB, CoFeNi, CoFeSi, CoFeGe, CoFeSiGe, $Co_2MnSi$, $Co_2MnGe$, NiFe, CoFeMnSi, CoFeMnGe, CoFeMnAlSi, and Fe oxide ($FeO_x$). A stacked film including at least two films of the films of the group recited above may be used as the first magnetic layer 10 and the second magnetic layer 20. The material and thickness of the first magnetic layer 10 may be the same as or different from the material and thickness of the second magnetic layer 20.

For example, CoFeMnSi is used as the first magnetic layer 10; and CoFeMnGe is used as the second magnetic layer 20.

The thickness of the first magnetic layer 10 is, for example, not less than 2 nm and not more than 10 nm. The thickness of the second magnetic layer 20 is, for example, not less than 2 nm and not more than 10 nm. The MR ratio becomes small when the thicknesses of the layers are less than 2 nm. Although a large MR ratio is obtained when the thicknesses of the layers exceed 10 nm, the total of the thickness of the first magnetic layer 10 and the thickness of the second magnetic layer 20 becomes excessively thick; and the stacked body 10s is no longer within the desired reproduction magnetic gap.

The length (the width) of the first magnetic layer 10 in a third direction (the Y-axis direction) that is orthogonal to the second direction that is orthogonal to the first direction (the X-axis direction) is, for example, not less than 15 nm and not more than 40 nm. The length (the width) of the second magnetic layer 20 in the third direction (the Y-axis direction) is, for example, not less than 5 nm and not more than 40 nm. An appropriate track width is obtained by such settings.

The intermediate layer 30 includes, for example, at least one selected from Cu, Ru, Au, Ag, Zn, and Ga. The intermediate layer 30 may include, for example, a stacked film including at least two films of these materials. The thickness of the intermediate layer 30 is, for example, not less than 2 nm and not more than 6 nm. In the case where the thickness of the intermediate layer 30 is less than 2 nm, the magnetic coupling (the interlayer coupling (Hin)) between the first magnetic layer 10 and the second magnetic layer 20 is too strong; and the first magnetic layer 10 and the second magnetic layer 20 have poor magnetic field response to an external magnetic field (the magnetic field from the magnetic recording medium 80). In the case where the thickness of the intermediate layer 30 exceeds 6 nm, the thickness of the stacked body 10s becomes excessively thick and is no longer within the desired reproduction gap.

For example, the hard bias unit 75 may include a CoPt alloy.

Second Embodiment

FIG. 6A and FIG. 6B are schematic cross-sectional views showing a magnetoresistance effect element according to a second embodiment.

FIG. 6A is a cross-sectional view corresponding to line A1-A2 of FIG. 1A. FIG. 6B is a cross-sectional view corresponding to line B1-B2 of FIG. 1A.

As shown in FIG. 6A and FIG. 6B, a third magnetic layer 53 and a fourth magnetic layer 54 are further provided in the magnetoresistance effect element 220 according to the embodiment. It is sufficient for at least one selected from the third magnetic layer 53 and the fourth magnetic layer 54 to be provided in the embodiment. Otherwise, the configuration of the magnetoresistance effect element 220 is similar to the magnetoresistance effect element 210.

The third magnetic layer 53 is provided between the second Ru layer 42 and the second shield 72. The third magnetic layer 53 includes at least one selected from the group consisting of an amorphous magnetic alloy (e.g., $Co_{80}Zr_{10}Nb_{10}$ (atomic %)), an FeCr alloy, an FeV alloy, and Fe. The third magnetic layer 53 is conductive. For example, the third magnetic layer 53 contacts the second Ru layer 42 and the second shield 72. The thickness of the third magnetic layer 53 is, for example, not less than 0.5 nm and not more than 10 nm.

The fourth magnetic layer 54 is provided between the first Ru layer 41 and the first shield 71. The fourth magnetic layer 54 includes at least one selected from the group consisting of an amorphous magnetic alloy (e.g., $Co_{80}Zr_{10}Nb_{10}$ (atomic %)), an FeCr alloy, an FeV alloy, and Fe. The fourth magnetic layer 54 is conductive. For example, the fourth magnetic layer 54 contacts the first Ru layer 41 and the first shield 71. The thickness of the fourth magnetic layer 54 is, for example, not less than 0.5 nm and not more than 10 nm.

In the case where the thickness of the third magnetic layer 53 and the thickness of the fourth magnetic layer 54 are less than 0.5 nm, it becomes difficult to realize the soft magnetic properties or the negative MR effect of the magnetic layers. In the case where the thicknesses exceed 10 nm, the negative MR effect becomes strong; and the positive MR effect of the first magnetic layer 10 and the second magnetic layer 20 drastically degrades.

In the magnetoresistance effect element 220 as well, the first thickness t1 of the first Ru layer 41 and the thickness t2 of the second Ru layer 42 are set to be not less than 1.5 nm and not more than 2.5 nm. In the magnetoresistance effect element 220, it is more favorable for the thickness of the second Ru layer 42 where the third magnetic layer 53 is provided to be set to be slightly thin, i.e., not less than 1.5 nm and not more than 2.0 nm. It is more favorable for the thickness of the second Ru layer 42 where the third magnetic layer 53 is provided to be set to be slightly thin, i.e., not less than 1.5 nm and not more than 2.0 nm.

For example, the magnetic exchange coupling energy can be adjusted by providing a layer of an amorphous magnetic alloy (e.g., $Co_{80}Zr_{10}Nb_{10}$ (atomic %)), an FeCr alloy, an FeV alloy, or Fe between the shield and the magnetic layer. Thereby, a high-resolution low-noise magnetoresistance effect element can be provided more stably.

FeCr alloys and FeV alloys have a negative GMR effect. The noise due to the magnetoresistance can be suppressed further by using an FeCr alloy or an FeV alloy.

Fe has good soft magnetic properties. Further, Fe can be used to function as a good foundation layer of a Heusler alloy. By using Fe, the MR ratio can be reduced. Thereby, the noise can be reduced further.

Third Embodiment

FIG. 7A and FIG. 7B are schematic cross-sectional views showing a magnetoresistance effect element according to a third embodiment.

FIG. 7A is a cross-sectional view corresponding to line A1-A2 of FIG. 1A. FIG. 7B is a cross-sectional view corresponding to line B1-B2 of FIG. 1A.

In the magnetoresistance effect element 230 according to the embodiment as shown in FIG. 7A and FIG. 7B, the first magnetic layer 10 has a first portion 10a and a second portion 10b. The second portion 10b is provided between the first portion 10a and the first shield 71. In other words, the first portion 10a is disposed between the second portion 10b and the intermediate layer 30. The second magnetic layer 20 has a third portion 20a and a fourth portion 20b. The fourth portion 20b is provided between the third portion 20a and the second shield 72. In other words, the third portion 20a is disposed between the fourth portion 20b and the intermediate layer 30. Otherwise, the configuration of the magnetoresistance effect element 230 is similar to the magnetoresistance effect element 210.

The first portion 10a and the third portion 20a may include, for example, at least one selected from the group consisting of CoFe, CoFeB, CoFeNi, CoFeSi, CoFeGe, CoFeSiGe, $Co_2MnSi$, $Co_2MnGe$, NiFe, CoFeMnSi, CoFeMnGe, CoFeMnAlSi, and Fe oxide ($FeO_x$). A stacked film including at least two films of the films of the group recited above may be used as the first portion 10a and the third portion 20a. The material and thickness of the first portion 10a may be the same as or different from the material and thickness of the third portion 20a. The thicknesses of the first portion 10a and the third portion 20a are, for example, not less than 2 nm and not more than 10 nm. In the case where the thicknesses of the portions are less than 2 nm, the MR ratio is small. Although a large MR ratio is obtained in the case where the thicknesses of the portions exceed 10 nm, the thickness of the stacked body 10s becomes excessively thick; and the stacked body 10s is no longer within the desired reproduction magnetic gap.

The second portion 10b and the fourth portion 20b may include at least one selected from the group consisting of an amorphous magnetic alloy (e.g., $Co_{80}Zr_{10}Nb_{10}$ (atomic %)), an FeCr alloy, an FeV alloy, and Fe. The second portion 10b and the fourth portion 20b are conductive. For example, the second portion 10b contacts the first portion 10a and the first Ru layer 41. For example, the fourth portion 20b contacts the third portion 20a and the second Ru layer 42. The thicknesses of the second portion 10b and the fourth portion 20b are, for example, not less than 0.5 nm and not more than 10 nm.

It is more favorable for the thickness of the first Ru layer 41 where the second portion 10b is provided to be set to be slightly thin, i.e., not less than 1.5 nm and not more than 2.0 nm. It is more favorable for the thickness of the second Ru layer 42 where the fourth portion 20b is provided to be set to be slightly thin, i.e., not less than 1.5 nm and not more than 2.0 nm.

For example, the magnetic exchange coupling energy between the first portion 10a and the first shield 71 and the magnetic exchange coupling energy between the third portion 20a and the second shield 72 can be adjusted by providing the second portion 10b and the fourth portion 20b. Thereby, a high-resolution low-noise magnetoresistance effect element can be provided more stably. The noise due to the magnetoresistance can be suppressed further by using an FeCr alloy or an FeV alloy.

At least one selected from the third magnetic layer 53 and the fourth magnetic layer 54 described in regard to the second embodiment may be provided in combination with at least one selected from the second portion 10b and the fourth portion 20b.

Fourth Embodiment

The embodiment relates to a magnetic head assembly and a magnetic recording and reproducing device that use the magnetoresistance effect elements according to the first and second embodiments.

Figure 8:
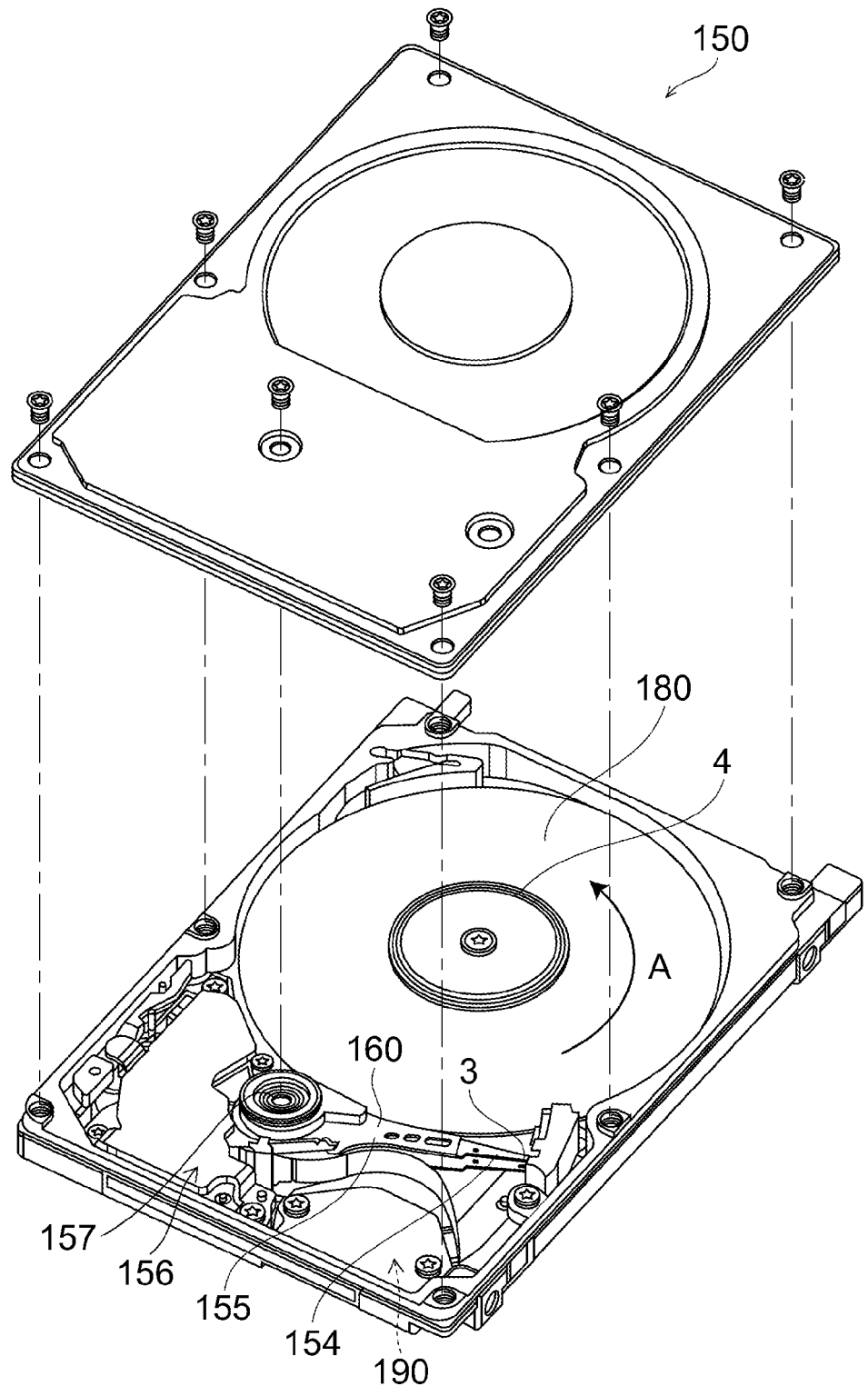
FIG. 8 is a schematic perspective view showing the magnetic recording and reproducing device according to the fourth embodiment.

FIG. 8 is a schematic perspective view showing the magnetic recording and reproducing device according to the fourth embodiment.

Figure 9A:
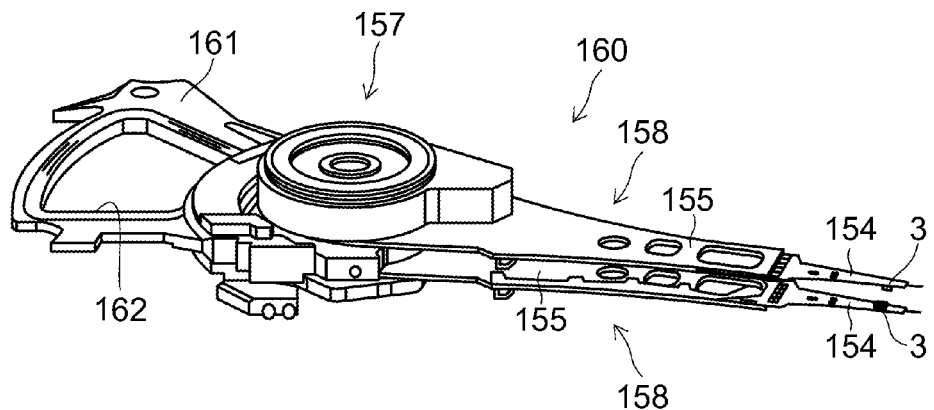
FIG. 9A and FIG. 9B are schematic perspective views showing portions of the magnetic recording device according to the fourth embodiment.
Figure 9B:
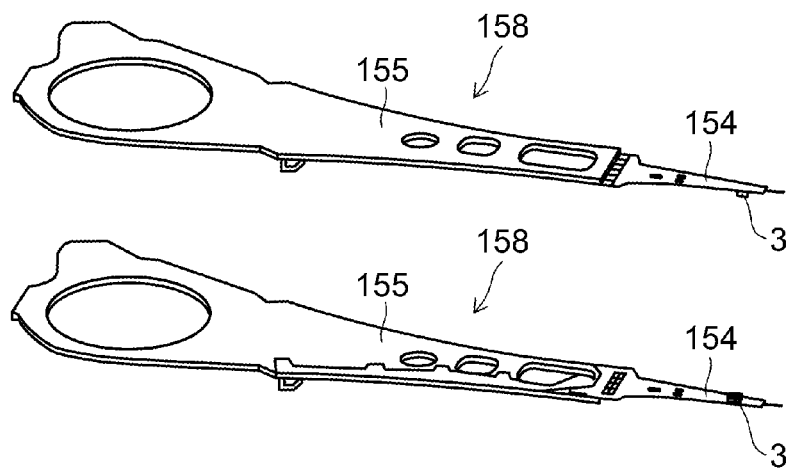

FIG. 9A and FIG. 9B are schematic perspective views showing portions of the magnetic recording device according to the fourth embodiment.

As shown in FIG. 8, the magnetic recording and reproducing device 150 according to the embodiment is a device that uses a rotary actuator. A recording medium disk 180 is mounted to a spindle motor 4. The recording medium disk 180 is rotated in the direction of arrow A by a not-shown motor. The motor responds to, for example, a control signal from a not-shown drive apparatus controller. The magnetic recording and reproducing device 150 according to the embodiment may include multiple recording medium disks 180.

The recording/reproducing of the information stored in the recording medium disk 180 is performed by the head slider 3. The head slider 3 has the configuration described above. The head slider 3 is mounted to the tip of a suspension 154. The suspension 154 has a thin-film configuration. For example, the magnetic head (e.g., the magnetic head 110) according to the embodiment described above or a modification of the magnetic head is mounted at the vicinity of the tip of the head slider 3. The magnetic head may be the magnetoresistance effect elements according to the first to third embodiments or a magnetoresistance effect element of a modification of these elements.

When the recording medium disk 180 rotates, the head slider 3 is held above the surface of the recording medium disk 180. In other words, the downward pressure due to the suspension 154 is balanced by the pressure produced by the medium-opposing surface of the head slider 3. Thereby, the distance between the medium-opposing surface of the head slider 3 and the surface of the recording medium disk 180 is maintained at a prescribed value. In the embodiment, a so-called contact-sliding head slider 3 that contacts the recording medium disk 180 may be used.

The suspension 154 is connected to one end of an actuator arm 155. The actuator arm 155 includes, for example, a bobbin unit that holds a not-shown drive coil, etc. A voice coil motor 156 is provided at the other end of the actuator arm 155. The voice coil motor 156 is, for example, one type of linear motor. The voice coil motor 156 may include, for example, a not-shown drive coil and a not-shown magnetic circuit. For example, the drive coil is wound onto the bobbin unit of the actuator arm 155. The magnetic circuit may include, for example, a not-shown permanent magnet and a not-shown opposing yoke. The permanent magnet and the opposing yoke oppose each other; and the drive coil is disposed between the permanent magnet and the opposing yoke.

The actuator arm 155 is held by, for example, not-shown ball bearings. The ball bearings are provided, for example, at two locations on and under a bearing unit 157. The voice coil motor 156 can cause the actuator arm 155 to rotate and slide unrestrictedly. As a result, the magnetic head can be moved to any position of the recording medium disk 180.

FIG. 9A shows the configuration of a portion of the magnetic recording and reproducing device and is an enlarged perspective view of a head stack assembly 160.

FIG. 9B is a perspective view showing a magnetic head assembly (a head gimbal assembly (HGA)) 158 which is a portion of the head stack assembly 160.

As shown in FIG. 9A, the head stack assembly 160 includes the bearing unit 157, the head gimbal assembly 158, and a support frame 161. The head gimbal assembly 158 extends from the bearing unit 157. The support frame 161 extends from the bearing unit 157 in the direction opposite to the HGA. The support frame 161 supports a coil 162 of the voice coil motor.

As shown in FIG. 9B, the head gimbal assembly 158 includes the actuator arm 155 and the suspension 154. The actuator arm 155 extends from the bearing unit 157. The suspension 154 extends from the actuator arm 155.

The head slider 3 is mounted to the tip of the suspension 154. The magnetic head according to the embodiment or a modification of the magnetic head is mounted to the head slider 3.

In other words, the magnetic head assembly (the head gimbal assembly) 158 according to the embodiment includes the magnetic head according to the embodiment, the head slider 3 to which the magnetic head is mounted, the suspension 154 that has the head slider 3 mounted to one end of the suspension 154, and the actuator arm 155 connected to the other end of the suspension 154.

The suspension 154 includes lead wires (not shown) for writing and reproducing signals, for a heater to adjust the fly height, etc. The lead wires are electrically connected to the electrodes of the magnetic head included in the head slider 3.

A signal processor 190 is provided to write and reproduce the signals to and from the magnetic recording medium by using the magnetic head.

The signal processor 190 is provided, for example, on the back surface side of the drawing of the magnetic recording and reproducing device 150 shown in FIG. 8. Input/output lines of the signal processor 190 are electrically connected to the magnetic head by being connected to electrode pads of the head gimbal assembly 158.

In other words, the signal processor 190 is electrically connected to the magnetic head.

The change of the resistance of the stacked body 10s of the magnetic head corresponding to the medium magnetic field recorded in the magnetic recording medium 80 is sensed by, for example, the signal processor 190.

Thus, the magnetic recording and reproducing device 150 according to the embodiment includes a magnetic recording medium, the magnetic head according to the embodiment recited above, a movable portion that is relatively movable in a state in which the magnetic recording medium and the magnetic head are separated from each other or in a state in which the magnetic recording medium and the magnetic head contact each other, a position control unit that aligns the magnetic head at a prescribed recording position of the magnetic recording medium, and a signal processor that writes and reproduces signals to and from the magnetic recording medium by using the magnetic head.

In other words, the recording medium disk 180 is used as the magnetic recording medium 80 recited above. The movable portion recited above may include the head slider 3.

The position control unit recited above may include the head gimbal assembly 158.

Thus, the magnetic recording and reproducing device 150 according to the embodiment includes the magnetic recording medium, the magnetic head assembly according to the embodiment, and the signal processor 190 that writes and reproduces signals to and from the magnetic recording medium by using the magnetic head mounted to the magnetic head assembly.

According to the magnetic recording and reproducing device 150 according to the embodiment, high reproduction resolution and low noise reproduction is possible by using the magnetic head according to the embodiment recited above.

According to the embodiments, a magnetoresistance effect element, a magnetic head, a magnetic head assembly, and a magnetic recording and reproducing device having high reproduction resolution and low noise can be provided.

In this specification, "perpendicular" and "parallel" are not always exactly perpendicular and parallel and include, for example, variation in the manufacturing process.

Hereinabove, embodiments of the invention are described with reference to specific examples. However, the invention is not limited to these specific examples. For example, one skilled in the art may similarly practice the invention by appropriately selecting specific configurations of components included in the magnetoresistance effect element, the magnetic head, the magnetic head assembly, and the magnetic recording and reproducing device such as the first shield, the second shield, the first to fourth magnetic layers, the intermediate layer, the insulating unit, etc., from known art; and such practice is within the scope of the invention to the extent that similar effects are obtained.

Components in two or more of the specific examples can be combined with each other as long as technically feasible, and such combinations are also encompassed within the scope of the invention as long as they fall within the spirit of the invention.

The light emitting device and a method for manufacturing the same described above as the embodiments of the invention can be suitably modified and practiced by those skilled in the art, and such modifications are also encompassed within the scope of the invention as long as they fall within the spirit of the invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

What is claimed is:

1. A magnetoresistance effect element, comprising:
   a first shield;
   a second shield;
   a stacked body including
      a first magnetic layer provided between the first shield and the second shield, a magnetization of the first magnetic layer being changeable,
      a second magnetic layer provided between the first magnetic layer and the second shield, a magnetization of the second magnetic layer being changeable,
      an intermediate layer provided between the first magnetic layer and the second magnetic layer, the intermediate layer being nonmagnetic,
      a first Ru layer provided between the first shield and the first magnetic layer, a thickness of the first Ru layer being not less than 1.5 nanometers and not more than 2.5 nanometers, and
      a second Ru layer provided between the second magnetic layer and the second shield, a thickness of the second Ru layer being not less than 1.5 nanometers and not more than 2.5 nanometers;
   a third magnetic layer provided between the second Ru layer and the second shield, the third magnetic layer contacting the second Ru layer and the second shield, the third magnetic layer including at least one selected from the group consisting of an amorphous magnetic alloy, an FeCr alloy, an FeV alloy, and Fe; and
   a hard bias unit provided between the first shield and the second shield, a first direction from the first shield toward the second shield intersecting a second direction from the stacked body toward the hard bias unit.

2. The element according to claim 1, wherein the second Ru layer contacts the second magnetic layer.

3. The element according to claim 1, wherein a magnetic exchange coupling energy between the second magnetic layer and the second shield is not less than 0.05 erg/square centimeter and not more than 0.15 erg/square centimeter.

4. The element according to claim 1, wherein a thickness of the third magnetic layer is not less than 0.5 nanometers and not more than 10 nanometers.

5. The element according to claim 1, wherein the first Ru layer contacts the first magnetic layer.

6. The element according to claim 1, wherein a magnetic exchange coupling energy between the first magnetic layer and the first shield is not less than 0.05 erg/square centimeter and not more than 0.15 erg/square centimeter.

7. The element according to claim 1, further comprising a fourth magnetic layer provided between the first Ru layer and the first shield, the fourth magnetic layer including at least one selected from the group consisting of an amorphous magnetic alloy, an FeCr alloy, an FeV alloy, and Fe.

8. The element according to claim 7, wherein the fourth magnetic layer contacts the first Ru layer and the first shield.

9. The element according to claim 7, wherein a thickness of the fourth magnetic layer is not less than 0.5 nanometers and not more than 10 nanometers.

10. The element according to claim 1, wherein
    the first magnetic layer includes a first portion and a second portion, the second portion being provided between the first portion and the first shield, and
    the second portion includes at least one selected from the group consisting of an amorphous magnetic alloy, an FeCr alloy, an FeV alloy, and Fe.

11. The element according to claim 10, wherein a thickness of the second portion is not less than 0.5 nanometers and not more than 10 nanometers.

12. The element according to claim 1, wherein
    the second magnetic layer includes a third portion, and a fourth portion provided between the third portion and the second shield, and
    the fourth portion includes at least one selected from the group consisting of an amorphous magnetic alloy, an FeCr alloy, an FeV alloy, and Fe.

13. The element according to claim 12, wherein a thickness of the fourth portion is not less than 0.5 nanometers and not more than 10 nanometers.

14. A magnetic head comprising a magnetoresistance effect element, the magnetoresistance effect element including:
- a first shield;
- a second shield;
- a stacked body including
  - a first magnetic layer provided between the first shield and the second shield, a magnetization of the first magnetic layer being changeable,
  - a second magnetic layer provided between the first magnetic layer and the second shield, a magnetization of the second magnetic layer being changeable,
  - an intermediate layer provided between the first magnetic layer and the second magnetic layer, the intermediate layer being nonmagnetic,
  - a first Ru layer provided between the first shield and the first magnetic layer, a thickness of the first Ru layer being not less than 1.5 nanometers and not more than 2.5 nanometers, and
  - a second Ru layer provided between the second magnetic layer and the second shield, a thickness of the second Ru layer being not less than 1.5 nanometers and not more than 2.5 nanometers;
- a third magnetic layer provided between the second Ru layer and the second shield, the third magnetic layer contacting the second Ru layer and the second shield, the third magnetic layer including at least one selected from the group consisting of an amorphous magnetic alloy, an FeCr alloy, an FeV alloy, and Fe; and
- a hard bias unit provided between the first shield and the second shield, a first direction from the first shield toward the second shield intersecting a second direction from the stacked body toward the hard bias unit.

15. A magnetic head assembly, comprising:
- a magnetic head including a magnetoresistive effect element, the magnetoresistive effect element including
  - a first shield;
  - a second shield;
  - a stacked body including
    - a first magnetic layer provided between the first shield and the second shield, a magnetization of the first magnetic layer being changeable,
    - a second magnetic layer provided between the first magnetic layer and the second shield, a magnetization of the second magnetic layer being changeable,
    - an intermediate layer provided between the first magnetic layer and the second magnetic layer, the intermediate layer being nonmagnetic,
    - a first Ru layer provided between the first shield and the first magnetic layer, a thickness of the first Ru layer being not less than 1.5 nanometers and not more than 2.5 nanometers, and
    - a second Ru layer provided between the second magnetic layer and the second shield, a thickness of the second Ru layer being not less than 1.5 nanometers and not more than 2.5 nanometers;
  - a third magnetic layer provided between the second Ru layer and the second shield, the third magnetic layer contacting the second Ru layer and the second shield, the third magnetic layer including at least one selected from the group consisting of an amorphous magnetic alloy, an FeCr alloy, an FeV alloy, and Fe; and
  - a hard bias unit provided between the first shield and the second shield, a first direction from the first shield toward the second shield intersecting a second direction from the stacked body toward the hard bias unit;
- a suspension, the magnetic head being mounted at one end of the suspension; and
- an actuator arm connected to another end of the suspension.

16. A magnetic recording and reproducing device, comprising:
- a magnetic head assembly, the magnetic head assembly including
  - a magnetic head, the magnetic head including a magnetoresistive effect element, the magnetoresistive effect element including
    - a first shield;
    - a second shield;
    - a stacked body including
      - a first magnetic layer provided between the first shield and the second shield, a magnetization of the first magnetic layer being changeable,
      - a second magnetic layer provided between the first magnetic layer and the second shield, a magnetization of the second magnetic layer being changeable,
      - an intermediate layer provided between the first magnetic layer and the second magnetic layer, the intermediate layer being nonmagnetic,
      - a first Ru layer provided between the first shield and the first magnetic layer, a thickness of the first Ru layer being not less than 1.5 nanometers and not more than 2.5 nanometers, and
      - a second Ru layer provided between the second magnetic layer and the second shield, a thickness of the second Ru layer being not less than 1.5 nanometers and not more than 2.5 nanometers;
    - a third magnetic layer provided between the second Ru layer and the second shield, the third magnetic layer contacting the second Ru layer and the second shield, the third magnetic layer including at least one selected from the group consisting of an amorphous magnetic alloy, an FeCr alloy, an FeV alloy, and Fe; and
    - a hard bias unit provided between the first shield and the second shield, a first direction from the first shield toward the second shield intersecting a second direction from the stacked body toward the hard bias unit;
  - a suspension, the magnetic head being mounted at one end of the suspension; and
  - an actuator arm connected to another end of the suspension; and
- a magnetic recording medium including information to be reproduced using the magnetic head.

17. A magnetoresistance effect element, comprising:
- a first shield;
- a second shield;
- a stacked body including
  - a first magnetic layer provided between the first shield and the second shield, a magnetization of the first magnetic layer being changeable,
  - a second magnetic layer provided between the first magnetic layer and the second shield, a magnetization of the second magnetic layer being changeable,
  - an intermediate layer provided between the first magnetic layer and the second magnetic layer, the intermediate layer being nonmagnetic, and
  - a first Ru layer provided between the first shield and the first magnetic layer, a thickness of the first Ru layer being not less than 1.5 nanometers and not more than 2.5 nanometers;

a third magnetic layer provided between the first Ru layer and the first shield, the third magnetic layer contacting the first Ru layer and the first shield, the third magnetic layer including at least one selected from the group consisting of an amorphous magnetic alloy, an FeCr alloy, an FeV alloy, and Fe; and a hard bias unit provided between the first shield and the second shield, a first direction from the first shield toward the second shield intersecting a second direction from the stacked body toward the hard bias unit.

18. The element according to claim 17, wherein a thickness of the third magnetic layer is not less than 0.5 nanometers and not more than 10 nanometers.

19. A magnetic head comprising a magnetoresistance effect element, the magnetoresistance effect element including:
 a first shield;
 a second shield;
 a stacked body including
  a first magnetic layer provided between the first shield and the second shield, a magnetization of the first magnetic layer being changeable,
  a second magnetic layer provided between the first magnetic layer and the second shield, a magnetization of the second magnetic layer being changeable,
  an intermediate layer provided between the first magnetic layer and the second magnetic layer, the intermediate layer being nonmagnetic, and
  a first Ru layer provided between the first shield and the first magnetic layer, a thickness of the first Ru layer being not less than 1.5 nanometers and not more than 2.5 nanometers;
 a third magnetic layer provided between the first Ru layer and the first shield, the third magnetic layer contacting the first Ru layer and the first shield, the third magnetic layer including at least one selected from the group consisting of an amorphous magnetic alloy, an FeCr alloy, an FeV alloy, and Fe; and
 a hard bias unit provided between the first shield and the second shield, a first direction from the first shield toward the second shield intersecting a second direction from the stacked body toward the hard bias unit.

20. A magnetic head assembly, comprising:
 a magnetic head including a magnetoresistance effect element, the magnetoresistance effect element including:
  a first shield;
  a second shield;
  a stacked body including
   a first magnetic layer provided between the first shield and the second shield, a magnetization of the first magnetic layer being changeable,
   a second magnetic layer provided between the first magnetic layer and the second shield, a magnetization of the second magnetic layer being changeable,
   an intermediate layer provided between the first magnetic layer and the second magnetic layer, the intermediate layer being nonmagnetic, and
   a first Ru layer provided between the first shield and the first magnetic layer, a thickness of the first Ru layer being not less than 1.5 nanometers and not more than 2.5 nanometers;
  a third magnetic layer provided between the first Ru layer and the first shield, the third magnetic layer contacting the first Ru layer and the first shield, the third magnetic layer including at least one selected from the group consisting of an amorphous magnetic alloy, an FeCr alloy, an FeV alloy, and Fe; and
  a hard bias unit provided between the first shield and the second shield, a first direction from the first shield toward the second shield intersecting a second direction from the stacked body toward the hard bias unit;
 a suspension, the magnetic head being mounted at one end of the suspension; and
 an actuator arm connected to another end of the suspension.

21. A magnetic recording and reproducing device, comprising:
 a magnetic head assembly, the magnetic head assembly including:
  a magnetic head including a magnetoresistance effect element, the magnetoresistance effect element including
   a first shield;
   a second shield;
   a stacked body including
    a first magnetic layer provided between the first shield and the second shield, a magnetization of the first magnetic layer being changeable,
    a second magnetic layer provided between the first magnetic layer and the second shield, a magnetization of the second magnetic layer being changeable,
    an intermediate layer provided between the first magnetic layer and the second magnetic layer, the intermediate layer being nonmagnetic, and
    a first Ru layer provided between the first shield and the first magnetic layer, a thickness of the first Ru layer being not less than 1.5 nanometers and not more than 2.5 nanometers;
   a third magnetic layer provided between the first Ru layer and the first shield, the third magnetic layer contacting the first Ru layer and the first shield, the third magnetic layer including at least one selected from the group consisting of an amorphous magnetic alloy, an FeCr alloy, an FeV alloy, and Fe; and
   a hard bias unit provided between the first shield and the second shield, a first direction from the first shield toward the second shield intersecting a second direction from the stacked body toward the hard bias unit;
  a suspension, the magnetic head being mounted at one end of the suspension; and
  an actuator arm connected to another end of the suspension; and
 a magnetic recording medium including information to be reproduced using the magnetic head.

* * * * *